United States Patent [19]

Daube et al.

[11] Patent Number: 5,277,778
[45] Date of Patent: Jan. 11, 1994

[54] METHOD FOR COATING COMPONENTS OR SHAPES BY CATHODE SPUTTERING

[75] Inventors: Christoph Daube, Frankfurt; Uwe Kopacz, Hainburg; Siegfried Schulz, Hanau, all of Fed. Rep. of Germany

[73] Assignee: Leybold AG, Hanau, Fed. Rep. of Germany

[21] Appl. No.: 755,292

[22] Filed: Sep. 5, 1991

[30] Foreign Application Priority Data

Jul. 13, 1991 [DE] Fed. Rep. of Germany ....... 4123274

[51] Int. Cl.$^5$ .............................................. C23C 14/34
[52] U.S. Cl. ........................... 204/298.19; 204/298.16; 204/298.18; 204/298.26
[58] Field of Search ...................... 204/192.12, 298.06, 204/298.12, 298.16, 298.17, 298.18, 298.19, 298.23, 298.26

[56] References Cited

U.S. PATENT DOCUMENTS

| 4,013,532 | 3/1977 | Cormia et al. | 204/298.19 X |
|---|---|---|---|
| 4,411,763 | 10/1983 | Itaba et al. | 204/298.19 X |
| 4,426,267 | 1/1984 | Munz et al. | 204/298.16 X |
| 4,457,825 | 7/1984 | Lamont, Jr. | 204/298 |
| 4,622,121 | 11/1986 | Wegmann et al. | 204/298 |
| 4,657,654 | 4/1987 | Mintz | 204/298 |
| 4,810,347 | 3/1989 | Smith | 204/298 |
| 4,871,434 | 10/1989 | Munz et al. | 204/298.06 X |
| 4,880,515 | 11/1989 | Yoshikawa et al. | 204/298.19 X |
| 5,006,219 | 4/1991 | Latz et al. | 204/298.19 X |
| 5,022,978 | 6/1991 | Hensel et al. | 204/298.19 |
| 5,069,772 | 12/1991 | Fritsche et al. | 204/298.19 X |

Primary Examiner—Nam Nguyen
Attorney, Agent, or Firm—Felfe & Lynch

[57] ABSTRACT

Coating of components and shapes by cathode sputtering of target material of a first cathode system (6) with concentration of a first discharge space (plasma cloud) in the vicinity of the target surface by a spatially closed magnetic field (plasma trap) opposite the target (12). The field strength is reduced in front of the target surface by an additional magnet associated with a lateral boundary of the target.

9 Claims, 4 Drawing Sheets

METHOD FOR COATING COMPONENTS OR SHAPES BY CATHODE SPUTTERING

The invention relates to a method for coating components or shapes by cathode sputtering of target material of a first cathode system with concentration of a first discharge space (plasma cloud) adjacent the target surface by a magnetic field (plasma trap) that is spatially closed with respect to the target.

BACKGROUND OF THE INVENTION

A method for coating shapes having a tridimensional surface to be coated, by the cathode sputtering of target material is known (German Patent 31 07 914), to which U.S. Pat. No. 4,426,267 corresponds wherein the shape or shapes are exposed simultaneously, on the side opposite the cathode system, to the sputtering of a second cathode system with the same target material and with concentration of a second discharge space adjacent the target surface by a second magnetic field that is spatially closed with respect to the target. In this method a substrate bias is used, but it has to be within fixed limits considering the degree of ionization of the plasma, so that the substrate bias current per unit area has to be limited to less than 1 mA/cm$^2$. The substrate bias current can be increased only by increasing the substrate bias voltage. This, however, has a negative influence on the tension in the coatings, so that the applied coatings can easily break off.

For vacuum cathode sputtering processes magnetron cathodes are used so that a sufficient coating rate can be achieved. It is not possible by this method to coat three-dimensional substrates without providing for a complex rotatory movement of the substrates. The solution of this problem is disclosed in U.S. Pat. No. 4,426,267 in which a double cathode arrangement of these magnetic sources has been published. The use of this arrangement is limited, however, to a narrow range of dimensions of the substrate, especially because the degree of ionization of the plasma of the two magnetron cathodes cannot be affected by process parameters that have to be adjusted separately.

The degree of ionization is of crucial importance to the quality of the coating, because in most applications the achievement of ionic plating conditions is indispensable. For the double cathode arrangement this signifies that the magnetrons have to be arranged so that their plasma zones overlap and surround the substrate. Only then is it assured that the substrates, when they are given a negative bias, will be bombarded by inert gas ions in a manner similar to the target, in order to have a positive influence on the structures that form as the coating grows. Even under these conditions, however, the ion bombardment is not isotropic, so that differences in quality become visible on the parts being coated. The coating quality could be improved by increasing the bias current per unit area. This, however, can be achieved only within narrow limits in the conventional arrangement. A way of increasing the bias current might consist in increasing the bias applied during the coating. This change will, however, simultaneously increase the energy of the impinging ions, so that consequences must be expected as regards the coating structure and properties. It is known that particularly the internal tensions present in the coatings can be influenced by the bias voltage. Another way of increasing the ionization is to go to higher cathode outputs. This possibility exists because the degree of ionization depends on the intensity of the secondary electron emission in the cathode sputtering process. However, it is not possible for technical reasons to increase the cathode output without limit, especially because the design of the cathode cooling permits only a narrow range. For the reasons described, therefore, there is need for a way to achieve an increase of the bias current per unit area at the lowest possible bias voltage. To improve the all-around coating of substrates and increase the substrate current in cathode sputtering apparatus, especially for hard coatings, different magnetron cathodes have been used——the so-called ZPT cathodes which operate on the principle of the interpole target, in the same arrangement as in Penning cathodes, in a double-cathode arrangement. Especially due to the greater breadth of the cathode and the special configuration of the magnetic field, the result is an increase in the bias current per unit area in comparison to a Penning cathode arrangement by a factor of 5. Also, it is possible to vary the cathode power in greater bandwidths than in Penning magnetrons. This increase is favored especially by the anode effect of the gas sprinkler which is situated in the coating chamber and is at ground potential. The increased degree of ionization is also promoted by the fact that the magnet poles and the baffle box are held at floating potential. At the same time it is important for the plasma to spread out far into the space between the cathodes. The apparently possible way to increase the ionization, by strengthening the magnetic field, cannot achieve its aim because, due to the magnetic field intensification the more intense plasma becomes compressed in front of the target surface. A lower field strength prevails in the area directly around the substrates and consequently a lower ionization.

In the curves a vanishing of the poisoned areas can be achieved by strengthening the magnetic field. The SmCo magnets are replaced by NdFeB magnets.

Despite all these measures, even in the interpole target cathode (ZPT cathode) the bombardment of the substrates by ions decreases in the marginal area more than the coating rate does, so that the quality of the coating is markedly poorer precisely in its indepth action.

SUMMARY OF THE INVENTION

Accordingly, the invention is addressed to the problem of reducing the poisoning of the target surface or largely eliminating it.

This problem is solved in that the field strength in front of the target surface is reduced by means of at least one lateral boundary means associated with a magnet, at least one additional magnet being provided as a lateral boundary means. Thus the field strength directly in front of the target surface is reduced in a very simple and low-cost manner and the plasma is drawn into the substrate space. In this way substrate currents can also be achieved which are greater by a factor of about 2 at a distance of about 140 mm from the target surface than they can in an arrangement without an additional coil.

An improvement can be achieved by increasing the bias current if the confronting magnetrons are of inverse polarity. Surprisingly, even in the case of the ZPT cathodes, an increase appears, which amounts in this case even to a factor of 4 and hence is higher by a factor of 2 than the rate of increase due to the additional coils if the above-described additional lateral fields are simultaneously used.

Another possibility, according to further development of the apparatus according to the invention, is for the magnets (28) to be combined with an additional coil system which is mounted annularly around the cathode.

In further development of the invention it is advantageous to provide in addition to the first magnet an additional magnet as a lateral boundary and to have each magnet flanked by at least one additional magnet. According to a preferred embodiment, to increase the substrate bias current per unit area, each magnet associated with the target is flanked by two permanent magnets. An additional increase in the bias current per unit area is possible if, instead of the electromagnetic coils alongside the permanent magnets held in a yoke with the corresponding target, a special arrangement of additional permanent magnets is selected, the magnets of the magnetrons having an S-N-S polarization.

In conjunction with the arrangement of the magnet system, it is advantageous for each permanent magnet to be disposed on a baffle which is affixed to the yoke of the magnet system, and for the baffle to form an angle with respect to the one in the direction of the plasma to be formed.

It is furthermore advantageous for the baffles holding the magnets to be provided on both sides of the target and to be arranged so that two magnets are opposite one another on a transverse plane, this transverse plane being parallel to the target surface.

An especially strong enhancing effect is observed if the additional magnets are disposed at a special angle between 100° and 130°. To the right and left laterally beside each ZPT cathode in the double cathode arrangement, the magnets disposed approximately V-wise are mounted behind a baffle which is at a floating potential. A magnetic tunnel is thus produced in the plane of the baffle, but does not have the effect of cathode sputtering, because the baffle is not at a sufficiently negative potential. The N-S-N polarization of this additional magnet system is selected such that some of the lines of force additionally combine with the opposite baffle's magnetic field, while another portion of the lines of force runs in the direction of the magnetic pole of the ZPT magnetron. The baffles can be mounted perpendicularly or at any desired angle to the target surface. It has been found that the substrate current per unit area can be increased by this arrangement at least by a factor of 4 in comparison with the arrangement without additional magnetic fields.

It is furthermore advantageous for the margin of the target running perpendicular to the target surface to be angled toward the center. In this manner it can be brought about in a simple manner that sufficient material can still be ablated in this area. Elimination of the poisoned areas can be achieved by strengthening the magnetic field.

It is furthermore advantageous for the surfaces to run V-wise and to face in the direction of the opposite cathode sputtering apparatus whose target surface is also provided with surfaces aligned in a V.

DETAILED DESCRIPTION OF THE DRAWINGS

Figure 1:
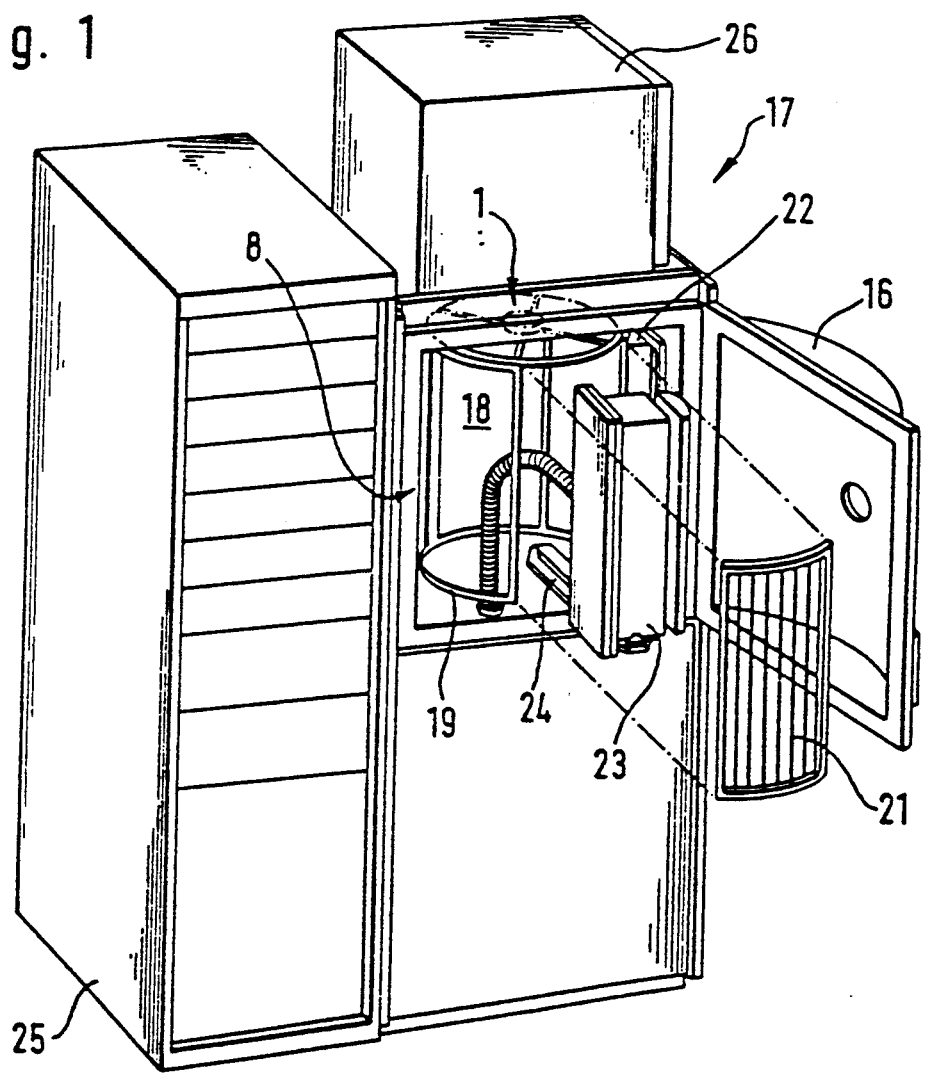
FIG. 1 is a perspective drawing of a batch apparatus for batch operation.

In FIG. 1 a cathode sputtering apparatus 17 is shown diagrammatically with the essential parts. It serves for coating three-dimensional parts of small size, such as watches, bracelets, small drills, or other tools. This apparatus is a batch-operated system with a vacuum chamber 18 having a diameter of about 700 mm. The vacuum chamber 18 has a forward-opening door 16 and a drum-shaped substrate holder 19 which is rotatable about a vertical axis and whose periphery is composed of individual segments 20. The peripheral segments 20 contain rods 21 to which workpieces are fastened. One of the segments 20 is drawn forward along the broken lines to facilitate the view into the apparatus.

On the circumference of the substrate holder 19 there is provided a first cathode system 22. In the operating state, this is situated opposite a second cathode system 23 in the interior of the substrate holder, which has been drawn forward. The second cathode system 23 is extended by means of a guide system 24 that is provided on the floor of the vacuum chamber. As soon as the cathode system 23 has been pulled forward so that it is situated opposite the first cathode system, the segment 20 can be replaced in the substrate holder 19.

Power is supplied by a power supply system 25 in conjunction with a high-frequency adapter 26 of which only the housing is represented. Details of the target and of the magnet system will be found in FIGS. 2 to 5.

Figure 2:
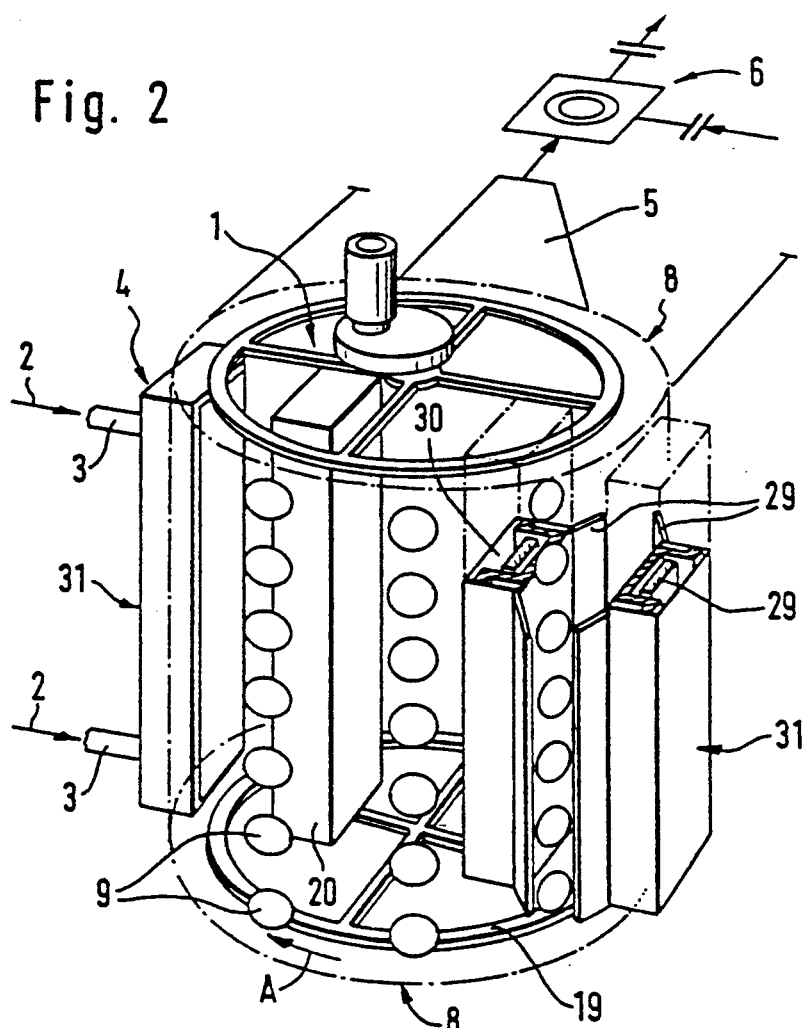
FIG. 2 is a perspective drawing of part of the batch apparatus of FIG. 1.
Figure 3:
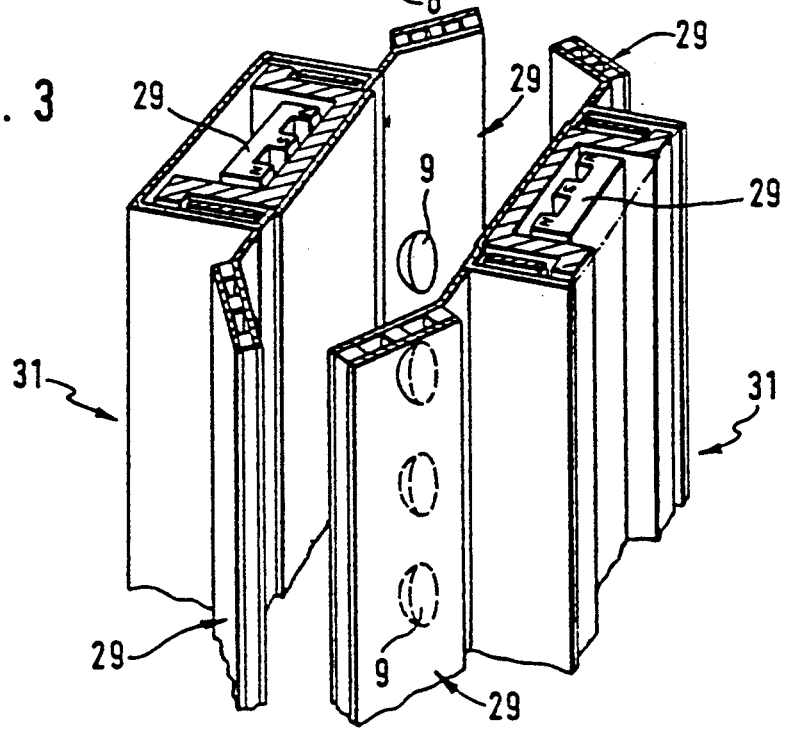
FIG. 3 is a view of a portion of the batch apparatus of FIG. 2, showing the corresponding magnets.

In FIG. 2 the cathode sputtering apparatus 17 of FIG. 1 is depicted in detail. As FIG. 2 indicates, on a cylindrical and vertically disposed vacuum chamber 1 (batch apparatus) a microwave source 2, a waveguide 3 and a horn antenna 4 or a high-frequency antenna of some other kind are installed axially on one side of the vacuum chamber 1 and a distribution box 5 as well as a high-vacuum pump 6 are connected to the opposite side of the vacuum chamber 1. A magnetron cathode 31 is located in the axial direction in the vacuum chamber 1.

Around the magnetron cathode 31 there is disposed a hollow cylindrical rotatable cage 8 designed as a substrate holder 19, which holds the substrates 9 on its periphery and moves them through or past the stationary plasma produced in the vacuum chamber 1.

On the vacuum chamber 1 here depicted in FIG. 2 there are provided two microwave sources 2 and waveguides 3. The distribution box 5 is attached to the center of the longitudinal side of the vacuum chamber for the balanced distribution of the suction capacity of the high vacuum pump 6. The substrates 9 to be coated are disposed on the periphery and over the entire length of the rotary cage 8.

The larger opening of the horn antenna 4 is closed by a quartz window adjoined by the magnet systems. The horn antenna is aligned vertically against the surface of the rotary cage 8 on which the substrates 9 are fastened.

Figure 5:
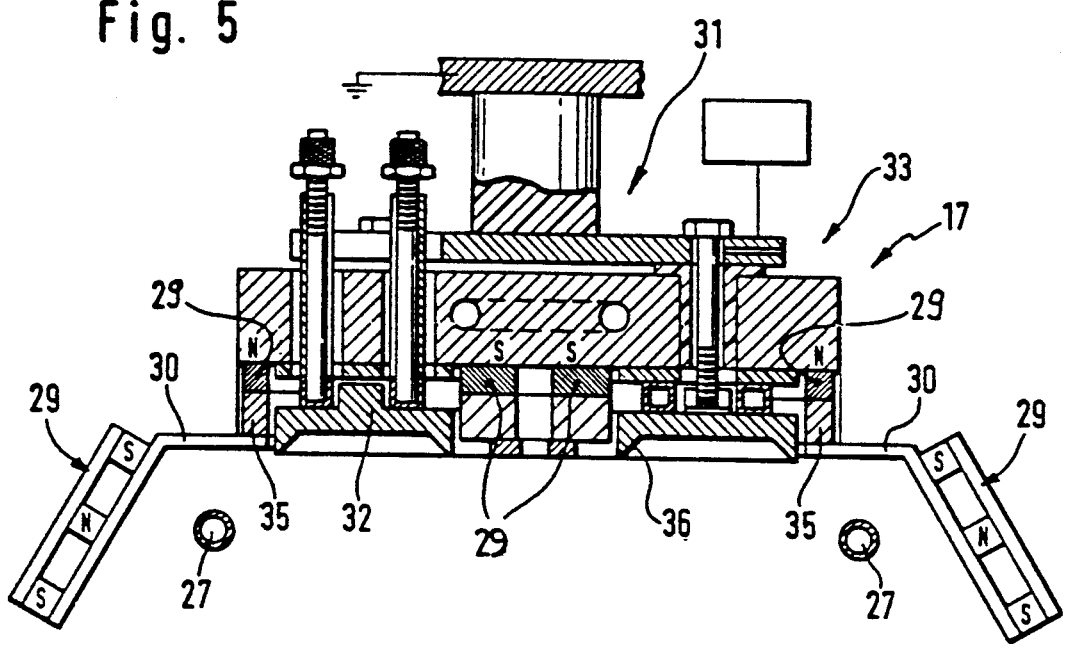
FIG. 5 shows the arrangement of additional magnets according to the invention in a double cathode system.
Figure 5:
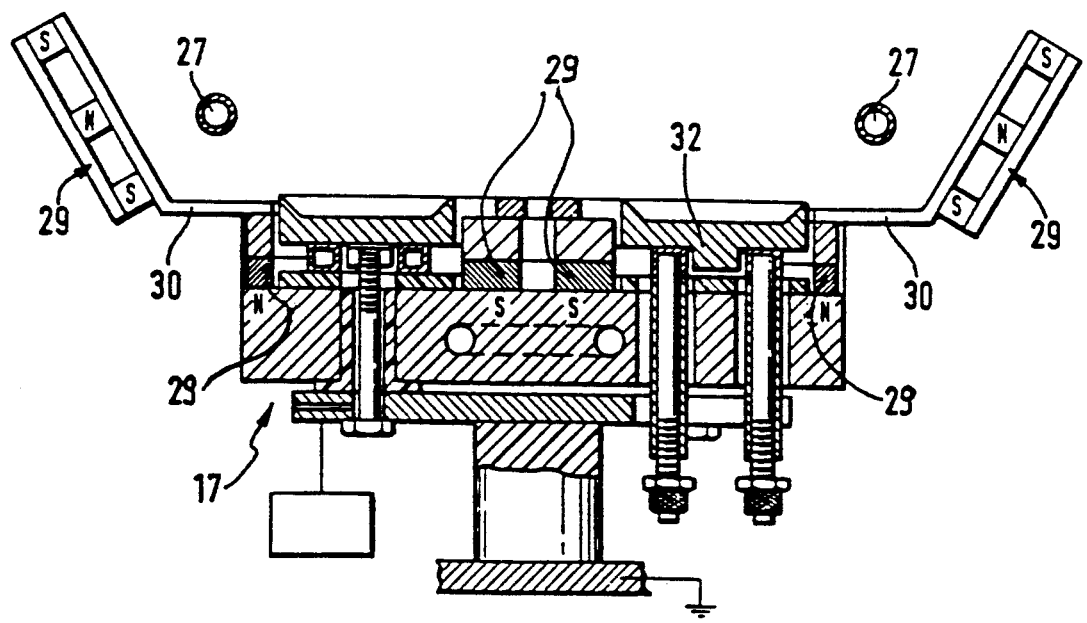

In FIG. 5 is represented the magnetron cathode 31 including cathode base 33, which can consist of a ferromagnetic material and at the same time forms the magnet yoke for the magnet system now to be described. The cathode base 33 has a system of ring magnets 28 with polarity as indicated. On the pole faces of the magnets 28 are pole shoes 35 on which baffles 30 are provided for the accommodation of additional magnets 29. A target 32 is fastened between the pole shoes 35. The target 32 forms the starting material for the coating to be produced, which is to be precipitated on a substrate 9 indicated in FIG. 2. According to FIG. 5, the target is placed between the two confronting magnet systems. The function of the additional magnets 29 will be described extensively in another part of this application.

The gas distributing tubes 27 represented in FIG. 5 for feeding process gas into the vacuum chamber 1 are provided with a series of bores and are fastened between the free magnet poles. A second process gas is introduced into the vacuum chamber 1 by means of gas distributing tubes 27 disposed at the level of the poles of the permanent magnets 29.

On the vacuum side, the antenna (not shown) is framed by an annular loop which is equipped with permanent magnets 28. This magnet system produces a closed, tunnel-like magnetic field. This magnetic field is of such a size that in a certain area between the free pole faces of the magnets it satisfies the electrocyclotron resonance condition for the microwave frequency used.

The resonance effect very effectively increases the energy transfer from the microwave field to the electrons contained in the plasma. The result is an extremely high reactivity of the heavy particles in comparison to DC- or RF-driven plasmas.

Aside from the resonance effect produced in the magnetic field, the magnetic field also reduces losses by diffusion of the charge carriers (containment) and in the present case, as a result of drift movements which it imposes on the charge carriers, it produces an equalization of the charge along the longitudinal axis of the magnet yoke.

The surfaces of the magnet system that are exposed to the plasma are advantageously equipped with an easily removable, heatable shield which can be cleaned outside of the apparatus and just as easily reinstalled at relatively great time intervals.

It is furthermore advantageous that this apparatus is outstandingly suitable as a plasma source for the coating and treatment of substrates with complex three-dimensional surfaces. The plasma source can also be inserted in the axial direction, parallel to the longitudinal axis of the chamber or azimuthally into the outer periphery of the cylindrical body of the process chamber.

The microwave transmitter can be operated either continuously or pulsed. Pulsed operation has proven advantageous. In the plasma OFF periods, especially in aerodynamically unfavorable areas of substrates of complex three-dimensional shape, a desirable gas exchange takes place, which produces an equalization of coating quality and rate distribution.

If the inside surface of concavely shaped substrates is to be coated, then in the case of the plasma source set axially into the outer periphery, the angular velocities and phases of the planetary movement have to be coordinated with one another in a certain manner in order to achieve optimum coating results.

The phases of the rotation of the planets about their own axes are established by the condition that the area of the projection of the inside surface-to-be-coated of concave substrates onto a plane perpendicular to the coating direction must be maximum at its nearest approach to the coating source.

If a batch apparatus according to FIG. 1, without a lock chamber is involved, the plasma source can be disposed along the geometrical axis of symmetry of the cylindrical base body of the process chamber.

In batch apparatus the individual process steps take place successively. Their advantage consists in their great flexibility and in the comparatively short time required to change over to a different system. In the apparatus according to FIG. 2, a pair of coating sources or cathode pair is provided, one on the left and one on the right, and between them the parts 9 suspended on a substrate cage 8 of circular plan are carried during the coating process. The substrate holders 19 for holding the substrates 9 can advantageously be divided into segments 20. These segments are loaded and pass through the preliminary cleaning. Loading then consists merely in replacing the coated with the uncoated segments. The batch time depends on the apparatus and the thickness of the coating on the substrates, and can take between 10 and 90 minutes. Due to the advantageous arrangement the exchange can be performed in a very short time, in one minute, for example.

The coating process thus far described is not limited to the arrangement represented in the drawing, but can also be used on other apparatus; for example, sputtering supported by a magnetic field (magnetron sputtering) can be performed.

The coating process herein described can also be performed in an inline apparatus in which the substrate holders do not necessarily have to perform a rotation about a common axis, but can be moved continuously by a linear drive through the various chambers lengthwise of the apparatus. The plasma source is so arranged that its longitudinal axis is at a right angle to the direction of substrate movement.

The arrangement with the additional magnetic fields according to FIG. 5 can easily be used in the case of a single cathode, quite regardless of what kind of magnetron it is and, in the case of a double cathode, especially a ZPT cathode (interpole target).

Advantageously, sufficient bias currents per unit area have been found in this double cathode arrangement, even when the spacing is greater than in the conventional arrangement, if the inert gas pressure is lowered to values under $3 \times 10^{-3}$ bar. Inasmuch as the quality of the all-around coating in this range of operation is sufficient, this leads to a further stabilization of the depositing processes used. Owing to the greater distance apart of the two interpole target cathodes, the range of application of the double cathode expands to larger substrate dimensions, without the need to rotate the parts to be coated in three dimensions. The new double cathode arrangement constitutes a substantial expansion of the conventional arrangement, whose use was limited to diameters smaller than about 20 millimeters.

In some coating processes the requirements regarding the level of the substrate current per unit area are still greater than can be achieved with the new ZPT arrangement (interpole target) without the use of additional aids. The special advantage of the arrangement is that it can be joined to an additional electromagnetic coil not represented in the drawing, which is mounted as a ring around the cathode. When this coil is operated, an additional magnetic field forms, which is oriented perpendicular to the target surface. Thus the field strength is further reduced directly in front of the target surface and the plasma is forced into the substrate space. In this manner substrate currents can be achieved which are greater by a factor of about 2 at a distance of 140 mm from the target surface than can be achieved without the additional coil.

A further increase of the bias current per unit area is possible if, instead of the electromagnet coil beside the permanent magnets 28 held in a yoke 31 with the corresponding target 32 according to FIG. 5, a special arrangement of additional permanent magnets 29 is selected. In it the magnets 29 of the magnetron are poled in accordance with FIG. 5. On the right and left side of each interpole target cathode in the double cathode arrangement, the magnets 29 arranged in a kind of V are placed behind a baffle 30 which is at a floating potential. In this manner a magnetic tunnel is produced in the plane of the baffle 30, but it does not have the effect of cathode sputtering because the baffle 30 is not at a sufficiently negative potential. The polarization N-S-N of this additional magnet arrangement is selected such that some of the lines of force additionally close on the opposite baffle magnetic shield. It has been found that the substrate current per unit area can be increased by this arrangement by a factor of 4 above the arrangement without additional magnetic fields. An especially strong increasing effect is observed if the additional magnets 29 are arranged at a special angle between 100° and 130°, relative to the plane of target 32.

The development thus far of the interpole target cathode (ZPT cathode) has related exclusively to metal coating processes. Reactive coating processes place greater demands on the magnetic field geometry of the magnetron, because otherwise there are zones on the target surface in which the target material reacts with the reactive gas and forms stable reaction products (target poisoning). This target poisoning leads not only to a lowering of the coating rate but also to a loss of coating quality. The poisoned zones develop in the interpole target cathode at the lateral raised edges, where no ablation of material takes place along the surface perpendicular to the target surface on account of the unfulfilled EXB requirement. These zones are especially extensive in the curves of the magnetron where the field strength is generally weaker than in the straight lines. For stable reactive processes it is essential to solve these problems. The aim is an arrangement in which no poisoned areas develop on the target surface. This can be achieved by two measures:

The edge running perpendicular to the target surface is sloped toward the center, i.e., provided with a bevel 36, so that in this area sufficient material will still be ablated, especially when a reactive coating process is the basis. In a reactive coating process, oxidation processes take place as a rule on the target, and this is to be avoided especially in the case of the interpole target cathode.

It is especially advantageous if no zone exists in which the reactive gas reacts with the target material. For this purpose the magnetic field is varied accordingly in a cost-saving manner, i.e., the strength of the magnet is modified such that the zone in the area of the target remains free of reaction products. The individual magnets can be set higher or lower with respect to the rest of the system.

To this end it is especially advantageous if no right angle occurs in the area of the corners of the target 12, but if instead the target 12 is slanted in this area or provided with the sloping surface 36.

An additional important advantage of the invention is the possibility of increasing the substrate bias current. For this purpose the additional magnets described are provided (according to FIG. 5).

Figure 4:
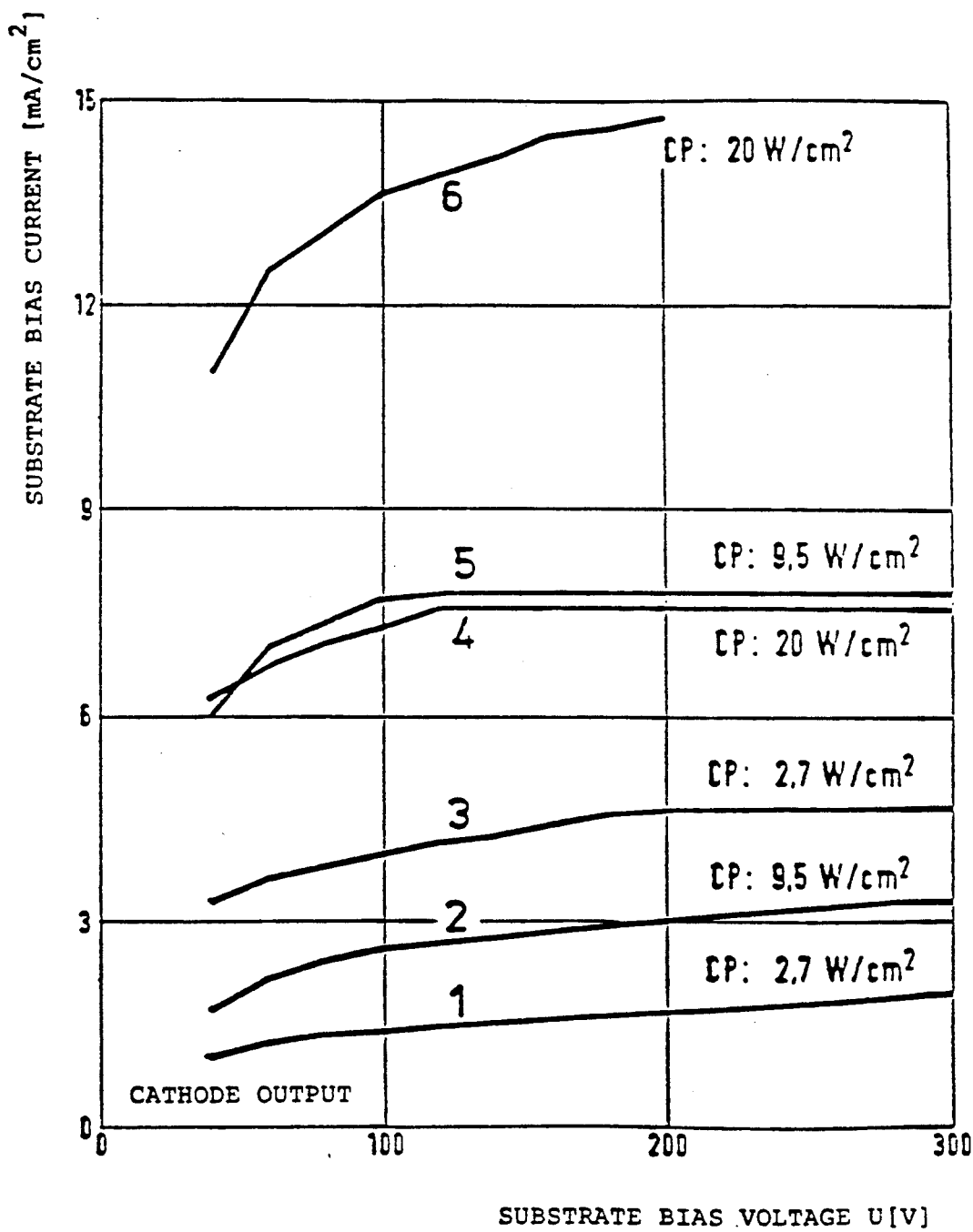
FIG. 4 shows a number of curves representing the substrate bias voltage at the achievable substrate current with the cathodes arranged in pairs.

In the individual sets of curves according to FIG. 4, the substrate bias current mA is plotted against the substrate bias voltage. The curve sets identified by 3 to 6 represent the new arrangement at a cathode power $CP = 20$ W/cm$^2$. With an arrangement according to the state of the art, a set of curves can be plotted which is below the first set. The result is a substantial improvement in the arrangement according to the invention.

We claim:

1. Apparatus for coating parts by cathode sputtering target material comprising
   a cathode,
   an inner permanent magnet loop and an outer permanent magnet loop arranged in front of said cathode, to generate a magnetic field having a magnetic field strength said loops having pole faces of opposite polarity opposite said cathode in order to form a plasma trap between said loops,
   a loop-like target having a planar target surface arranged between said inner loop and said outer loop, and
   auxiliary permanent magnet loop means arranged in front of said target and outside of said outer loop, said auxiliary magnet loop means having pole faces lying in a plane at an angle of 100° to 130° relative to the planar target surface, said auxiliary magnet loop means comprising a loop of permanent magnets adjacent said outer loop and having pole faces of opposite polarity as said outer loop so that the magnetic field strength over said target adjacent said outer loop is reduces.

2. Apparatus as in claim 1 further comprising a baffle, said auxiliary permanent magnet loop being fixed on said baffle opposite said plasma trap, said baffle being at floating potential relative to said cathode.

3. Apparatus as in claim 1 wherein said auxiliary permanent magnet loop means comprises at least two concentric loops of permanent magnets defining planes parallel to the planar target surface.

4. Apparatus as in claim 1 wherein said target has at least one peripheral surface at an angle to said planar target surface.

5. Apparatus for coating parts by cathode sputtering target material, said apparatus comprising a pair of opposed ZPT cathode arrangements between which said parts are coated, each arrangement comprising
   a cathode,
   an inner permanent magnet loop and an outer permanent magnet loop arranged in front of said cathode, to generate a magnetic field having a magnetic field strength said loops having pole faces of opposite polarity opposite said cathode in order to form a plasma trap between said loops,
   a loop-like target having a planar target surface arranged between said inner loop and said outer loop, and
   auxiliary permanent magnet loop means arranged in front of said target and outside of said outer loop, said auxiliary magnet loop means having pole faces lying in a plane at an angle of 100° to 130° relative to the planar target surface, said auxiliary magnet loop means comprising a loop of permanent magnets adjacent said outer loop and having pole faces of opposite polarity as said outer loop so that the magnetic field strength over said target adjacent said outer loop is reduced.

6. Apparatus as in claim 5 wherein the planar target surface of each ZPT cathode arrangement is in parallel facing relationship to each other ZPT cathode arrangement.

7. Apparatus as in claim 5 wherein the auxiliary permanent magnet loop means of each ZPT cathode arrangement has polarity which is arranged to form closed lines of force extending between said arrangements.

8. Apparatus as in claim 5 wherein each arrangement comprises a baffle to which said auxiliary permanent magnet loop means are fixed, said baffle being at floating potential relative to said cathode.

9. Apparatus as in claim 5 wherein each said auxiliary permanent magnet loop means comprises at least two concentric loops of permanent magnets each loop defining a plane parallel to the planar target surface.

* * * * *